United States Patent

Hirabayashi

[11] Patent Number: 5,807,432
[45] Date of Patent: Sep. 15, 1998

[54] PROCESS FOR PRODUCING DIAMOND COVERED MEMBER

[75] Inventor: Keiji Hirabayashi, Tokyo, Japan

[73] Assignee: Canon Kabushiki Kaisha, Tokyo, Japan

[21] Appl. No.: 547,424

[22] Filed: Oct. 24, 1995

Related U.S. Application Data

[62] Division of Ser. No. 207,627, Mar. 9, 1994, Pat. No. 5,483,084.

[30] Foreign Application Priority Data

Mar. 10, 1993 [JP] Japan .................................. 5-49525

[51] Int. Cl.$^6$ .................................................. C30B 23/00
[52] U.S. Cl. .............................. 117/87; 117/89; 117/104; 117/929; 423/446
[58] Field of Search ............................ 117/87, 89, 104, 117/929; 423/446

[56] References Cited

U.S. PATENT DOCUMENTS

| | | | |
|---|---|---|---|
| 4,816,286 | 3/1989 | Hirose | 423/446 |
| 5,174,983 | 12/1992 | Snail | 117/929 |
| 5,198,070 | 3/1993 | Jones | 117/929 |
| 5,275,798 | 1/1994 | Aida | 117/929 |
| 5,334,342 | 8/1994 | Harker et al. | 423/446 |
| 5,427,053 | 6/1995 | Tsuno et al. | 117/929 |
| 5,443,032 | 8/1995 | Vichr et al. | 117/84 |

FOREIGN PATENT DOCUMENTS

| | | | |
|---|---|---|---|
| 61-158899 | 7/1986 | Japan | 117/929 |
| 5-58785 | 3/1993 | Japan | 117/929 |

*Primary Examiner*—Robert Kunemund
*Attorney, Agent, or Firm*—Fitzpatrick, Cella, Harper & Scinto

[57] ABSTRACT

A diamond covered member which has a diamond crystal layer is formed by vapor phase synthesis on a surface of a substrate. The process comprises depositing plate-shaped diamond crystals by CVD at a carbon source concentration ranging from 0.01 to 10% at an atomic ratio of oxygen to carbon (O/C) of $0.5 \leq (O/C) \leq 1.2$ in a starting gas. The crystals may also be deposited by a burning flame method using an oxygen-acetylene flame at a molar ratio of oxygen to acetylene in a main starting gas in the range of $0.9 \leq (O_2/C_2H_2) \leq 1.0$. The plate-shaped diamond crystals are grown to coalesce into a film to form the diamond crystal layer.

6 Claims, 4 Drawing Sheets

PROCESS FOR PRODUCING DIAMOND COVERED MEMBER

This application is a division of application Ser. No. 08/207,627 filed Mar. 9, 1994, now U.S. Pat. No. 5,483,084.

BACKGROUND OF THE INVENTION

1. Field of the Invention

The present invention relates to a diamond covered member useful for semiconductor substrates, heat sinks, various protection films, optical parts, and the like. The present invention also relates to a process for producing the above diamond covered member.

2. Related Background Art

Diamond crystal, which has high hardness, high thermal conductivity, and excellent chemical stability, is widely used for cutting tools, abrasion-resistant tools, heat sinks (heat-releasing parts), and so forth. Furthermore, diamond semiconductors, which are doped with an impurity such as Group 3b and 5b elements of Periodic Table, have many advantages such as the band gap (5.4 eV), thereof being much larger than that of silicon semiconductor, the higher mobility of the positive holes therein, the mobility of electrons therein approximately equal to that of silicon, the small dielectric constant, the high thermal conductivity, and so forth.

Thin diamond crystal films are generally grown in a form of a rough polycrystal film on a substrate made of silicon, molybdenum, or the like. In recent years, methods are disclosed for epitaxial growth of diamond crystal on varieties of substrates and for formation of diamond crystal having a smooth surface for the purpose of utilizing the above characteristics of diamond crystal.

For example, diamond crystal is known to grow epitaxially on a diamond single-crystal substrate by vapor-phase synthesis. Japanese Patent Application Laid-Open No. 63-252998 discloses growth of a diamond single-crystal on a silicon carbide single-crystal substrate. Japanese Patent Application Laid-Open No. 64-3098 discloses growth of a diamond single-crystal on an oxide single-crystal substrate. Japanese Patent Application Laid-Open No. 2-233591 describes that a single-crystal diamond layer is formed when the lattice constant difference between the diamond crystal and the substrate is less than 20% and the molar ratio of carbon atoms and hydrogen atoms is in the range of from 1 to 10%. Japanese Patent Application Laid-Open No. 1-301864 describes the formation of thin film having maximum surface roughness of 200 Å or less composed of a mixture of diamond crystals, graphite crystals and amorphous carbon under the formation conditions of an organic gas concentration of 3 mol % or higher, and use thereof for a forming die for glass.

It is known that a diamond single-crystal substrate is extremely expensive, and is not useful practically. The epitaxial growth on a silicon carbide single-crystal substrate or an oxide single-crystal substrate gives granular crystals as the results of epitaxial growth of granular diamond single-crystals in a dispersed state, so that the formed film is poor in surface smoothness, usually having surface roughness (Rmax) of several hundred nm or more. Moreover, such a single-crystal substrate is extremely expensive generally and is disadvantageous in cost. The epitaxial growth on nickel, nickel-copper alloy, copper, or the like described in Japanese Patent Application Laid-Open No. 2-233591 gives similarly grown granular diamond crystals, and the resulting film is also poor in surface smoothness disadvantageously.

The thin film composed of a mixture of diamond crystals, graphite crystals, and amorphous carbon which is described in Japanese Patent Application Laid-Open No. 1-301864 gives a diamond thin film having maximum surface roughness of 200 Å or less. However, the incorporation of graphite in the crystal film deteriorates chemical stability, oxidation resistance, and thermal conductivity of the film, rendering the film practically useless for a semiconductor.

A specific plate-shaped diamond was proposed by the inventor in EPC Patent Application No. 93104860.7. The inventor's proposed plate-shaped diamond is formed on a substrate by vapor phase synthesis, and is characterized by the ratio of the length of a diamond crystal in a direction perpendicular to the substrate face to the length thereof in direction parallel to the face of the substrate ranging from 1:4 to 1:1000, and an upper face of the diamond crystal making an angle of from 0° to 10° to the face of the substrate. A method for forming the plate-shaped diamond crystal is also disclosed in the same EPC Patent Application, and is shown to be useful for electronics materials. The EPC Patent Application, however, does not describe growth of a plurality of plate-shaped diamond on a substrate and coalescence thereof into a film, nor uses of the diamond film.

SUMMARY OF THE INVENTION

An object of the present invention is to provide a diamond covered member which is free from the aforementioned disadvantages of known diamond film.

Another object of the present invention is to provide a covered member employing a film of plate-shaped diamond which is improved in comparison with the one disclosed in EPC Patent Application No. 93104860.7.

The diamond covered member of the present invention has a diamond crystal layer formed by vapor phase synthesis on a substrate, and the diamond crystal layer is constituted of plate-shaped diamond crystals at least at an initial stage of crystal growth, and is a polycrystal film which is formed by growth and coalescence of the plate-shaped diamond crystals and has surface roughness (Rmax) of not larger than 0.2 μm.

DESCRIPTION OF THE PREFERRED EMBODIMENT

The diamond covered member of the present invention has a diamond crystal layer formed by vapor phase synthesis on a substrate, the diamond crystal layer being constituted of plate-shaped diamond crystals at least at an initial stage of crystal growth, and being a polycrystal film formed by growth and coalescence of the plate-shaped diamond crystals and having surface roughness (Rmax) of not larger than 0.2 μm.

The present invention further includes a process for producing the above diamond covered member.

A first embodiment of the process for producing the diamond covered member having a diamond crystal layer formed by vapor phase synthesis on a surface of a substrate, the process comprising depositing plate-shaped diamond crystals by CVD at a carbon source concentration ranging from 0.01 to 10% at an atomic ratio of oxygen to carbon (O/C) of $0.5 \leq (O/C) \leq 1.2$ in a starting gas, and growing the plate-shaped diamond crystals to coalesce into a film to form the diamond crystal layer.

A second embodiment of the process for producing the diamond covered member having a diamond crystal layer formed by vapor phase synthesis on a surface of a substrate, the process comprising depositing plate-shaped diamond crystals by a burning flame method by use of oxygen-acetylene flame at an molar ratio of oxygen to acetylene ($O_2/C_2H_2$) in the range of $0.9 \leq (O_2/C_2H_2) \leq 1.0$ in a main starting gas, and growing the plate-shaped diamond crystals to coalesce into a film to form the diamond crystal layer.

The present invention is described more specifically together with related findings.

After comprehensive studies and experiments on the conditions of diamond synthesis to solve the problems on diamond covered members of prior art, the inventor of the present invention has found the dependence of morphology, especially orientation, of a diamond thin film on the diamond synthesis conditions. The present invention relates to improvement of the invention of the aforementioned EPC Patent Application No. 93104860.7.

Figure 1:
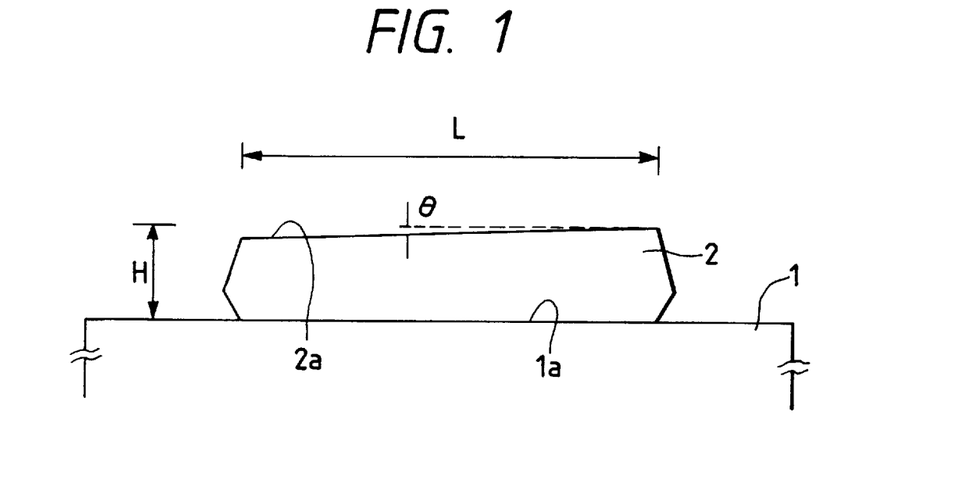
FIG. 1 is a schematic sectional view of a plate-shaped diamond crystal employed in the present invention.
Figure 2:
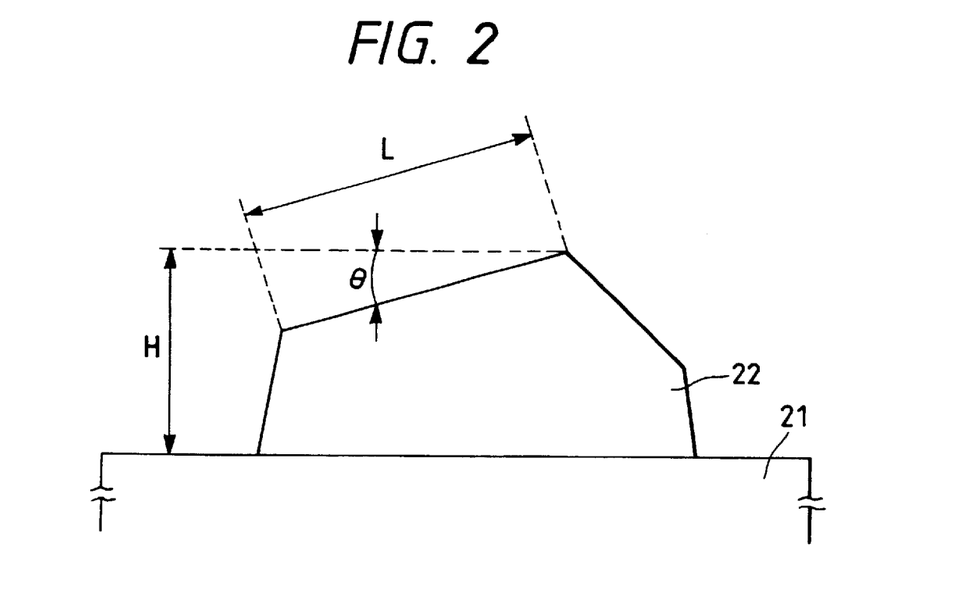
FIG. 2 is a schematic sectional view of a conventional granular diamond crystal.

FIG. 1 is a schematic sectional view of a plate-shaped diamond crystal employed in the present invention. FIG. 2 is a schematic sectional view of a conventional granular diamond crystal. The plate-shaped diamond as shown in FIG. 1 has been proposed by the inventor in the EPC Patent Application No. 93104860.7. In FIG. 1, a plate-shaped diamond crystal 2 is formed on a substrate 1. This plate-shaped diamond crystal has the ratio of the length or height (H) in direction perpendicular to the face of the substrate to the length or breadth (L) in direction parallel to the face of the substrate of 1:not less than 4, generally 1:not less than 4.5, preferably in the range of from 1:5 to 1:1000. The upper face 2a of the crystal makes an angle (θ) of not more than 10°, preferably not more than 5°, to the face 1a of the substrate. A diamond crystal of such morphology is hereinafter referred to as a plate-shaped diamond crystal.

On the contrary, the granular diamond crystal 22 formed by a conventional method as shown in FIG. 2 has the ratio of the height (H) to the breadth (L) of 1:not more than 3, generally 1:not more than 2, and the angle (θ) of the upper face of the granular crystal to the face of the substrate 21 varies at random.

Figure 6A:
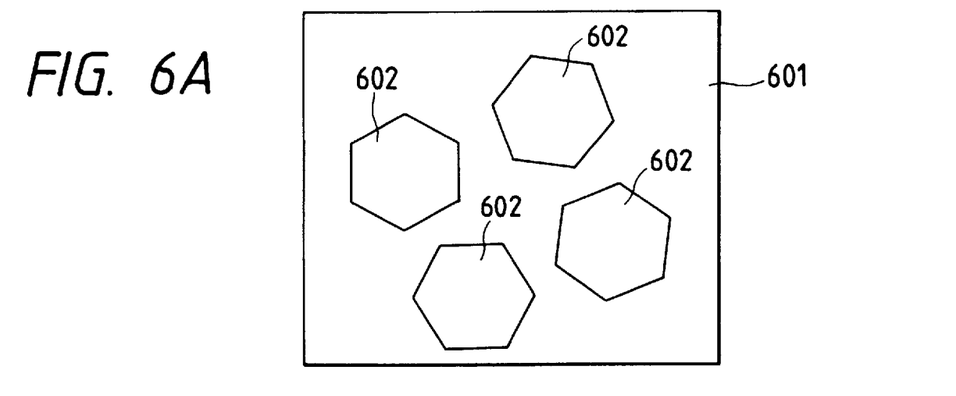
FIGS. 6A, 6B and 6C illustrate progress of formation of a film of plate-shaped diamond crystals in the present invention.
Figure 6B:
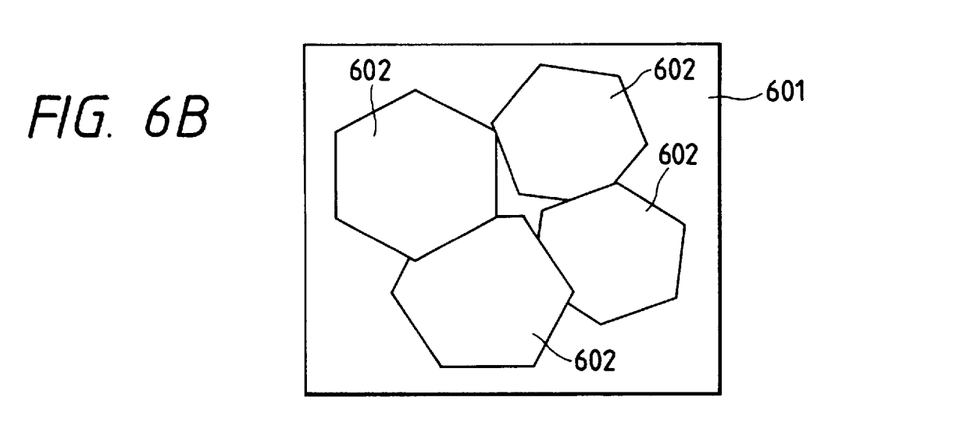
Figure 6C:
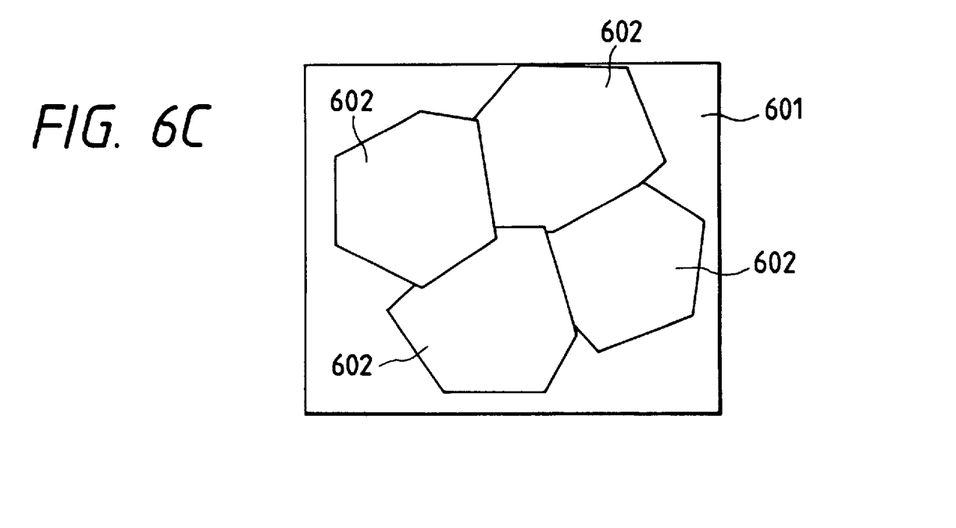

The plate-shaped diamond in FIG. 1 is one crystal grain of a polycrystal diamond film which constitutes the diamond covered member of the present invention. In the present invention, the diamond covered member comprises a film formed by coalescence of plurality of the crystal granules. The coalescence of the crystal granules is explained by reference to FIGS. 6A to 6C. In FIG. 6A, a plurality of plate-shaped diamond crystals 602 are disposed in a scattered state on a substrate 601. The plate-shaped diamond crystals 602 grow and coalesce as shown in FIG. 6B. The region surrounded by four diamond granules 602 has a concavity. The surface roughness (Rmax) of 0.2 μm or less is not obtained in this stage owing to the presence of this concavity. The diamond crystal granules 602 grow further as shown in FIG. 6C, whereby the concavity in the center region disappears and the surface roughness (Rmax) becomes 0.2 μm or less throughout the polycrystal.

The plate-shaped diamond polycrystal film is obtainable only under conditions for producing a very high-quality crystal. For example, the plate-shaped diamond polycrystal film can be formed by a CVD process and a burning flame method as described below. The CVD process includes hot-filament CVD, microwave CVD, magneto-microwave CVD, DC plasma CVD, RF plasma CVD, and the like.

The carbon source in the starting gases employed in the vapor phase synthesis process includes hydrocarbon gases such as methane, ethane, ethylene, acetylene, etc.; liquid organic compounds such as alcohol, acetone, etc.; carbon monoxide, and carbon halides. A gas containing hydrogen, oxygen, chlorine, fluorine, or the like may further be added, if necessary.

(1) Formation of Plate-shaped Diamond Polycrystal Film by CVD

The starting gas needs to contain at least elements of hydrogen, carbon, and oxygen. One starting gas may contain all the three elements, or a plurality of gases containing any of the elements in combination may be used. The concentration of the carbon source in the starting gas is required to be not more than 10%. The carbon source concentration herein means the value derived by calculation: [(carbon source gas flow rate)×(carbon atom number in carbon source gas)/(total starting gas flow rate)]×100.

The "carbon atom number in carbon source" is, for example, 1 for methane ($CH_4$), 3 for propane ($C_3H_8$), and 3 for acetone ($CH_3COCH_3$). The carbon source concentration is required to be not higher than 10% in order to suppress the supersaturation degree of the diamond crystal to prevent crystal growth particularly in height direction. The minimum of the carbon source concentration is not specially limited, but at the concentration of 0.01% or lower, the plate-shaped diamond crystal cannot always be formed at a practical formation rate.

Additionally, in the CVD process, the ratio of the number of oxygen atoms to the number of carbon atoms (O/C) in the starting gas is in the range of $0.5 \leq O/C \leq 1.2$, preferably $0.7 \leq O/C \leq 1.1$. At the O/C ratio of lower than 0.5, the effect of oxygen addition is not achievable, and a plate-shaped diamond crystal is not formed. At the O/C ratio of higher than 1.2, practical rate of diamond formation is not achievable owing to etching effect of oxygen. To the starting gas, an oxygen addition gas such as $O_2$, $H_2O$, and $N_2O$ may be added to adjust the above O/C ratio.

In the case where an oxygen-containing organic compound like an alcohol is employed as the carbon source, a plate-shaped diamond crystal can be formed even at a relatively low O/C ratio. For example, in the case where hydrogen and ethanol ($C_2H_5OH$) are used as the starting material gases, a plate-shaped diamond crystal of high quality can be obtained at the ratio O/C=0.5. The reason therefor is not known. Probably, it is due to the ease of generation of an active species of oxygen (OH radical) by the oxygen-containing compound.

The plate-shaped diamond polycrystal film employed in the present invention are formed at a relatively low degree of nucleation. For example, in crystal formation by a plasma CVD and hot filament CVD, plate-shaped diamond crystals are formed only at the nucleation density of not higher than $2 \times 10^6$ nuclei/mm², preferably in the range of from $1 \times 10^2$ to $1 \times 10^5$ nuclei/mm². The reason therefor is not clear. Probably, it is due to necessity for the sufficient amount of etching gas (hydrogen radicals or OH radicals) to retard the crystal growth in height direction and also for the sufficient amount of active species for diamond formation ($CH_x$ radicals, or the like) reaching the side faces required to promote the growth in lateral direction. Therefore, the nucleation density needs to be controlled to be low.

(2) Formation of Plate-shaped Diamond Polycrystal Film by Burning Flame Process

Oxygen-acetylene flame is employed in the burning flame process. The molar ratio of oxygen to acetylene in the main starting gas is in the range of $0.9 \leq O_2/C_2H_2 \leq 1.0$, preferably $0.95 \leq O_2/C_2H_2 \leq 0.99$ for forming the diamond crystal with high reproducibility at a relatively high growth rate (growth rate in lateral direction: several ten $\mu m/hr$).

In the aforementioned burning flame process, the nucleation density of the diamond crystal is controlled to be not higher than $1 \times 10^5$ nuclei/$mm^2$, preferably in the range of from $1 \times 10^2$ to $1 \times 10^5$ nuclei/$mm^2$. In the burning flame process, the nucleation density is controlled to be low. This is because, in the burning flame process, the growth rate of a plate-shaped diamond polycrystal film in lateral direction (several ten $\mu m/hr$) is ten times or more than that in hot-filament CVD or microwave CVD.

In the hot-filament CVD and various plasma CVD also, the spacings between the plate-shaped diamond crystals having a large breadth need to be sufficiently large. The necessary spacing depends on the crystal formation conditions, but is usually equal approximately to the breadth of the plate-shaped diamond crystal to be formed (10 $\mu m$ if the breadth is 10 $\mu m$).

The nucleation density is required to be controlled within the above ranges in the present invention in order to form plate-shaped diamond crystals at least at the initial stage of the crystal growth.

To describe the method for controlling nucleation density, the nucleation density can be increased by a method including: treatment for scratching a substrate surface with diamond paste, abrasive silicon carbide grain, or the like; application of fine particles of diamond, silicon carbide, boron nitride, carbon nitride, or the like having a size of not larger than 1 $\mu m$ onto a substrate surface; formation of an iron group metal such as iron, cobalt, and nickel in an extremely small thickness (several nm to several ten nm) on a substrate surface; and the like methods. The nucleation density can be lowered by treating the substrate surface by a method including: mirror-polishing by mechanochemical polishing; annealing treatment at a temperature ranging from 600° to 1000° C. in the air or in oxygen atmosphere; dry etching treatment by a reactive ion etching or ion beam etching; and wet etching treatment with an acid or an alkali. Such adjustment of nucleation density enables formation of plate-shaped diamond crystals in the initial stage of crystal growth.

The upper face of the plate-shaped diamond crystal employed in the present invention is a {111} plane having trigonal or hexagonal morphology, or a {100} plane having tetragonal or octagonal morphology. The lateral face thereof is a {111} plane or a {100} plane.

The morphology of the upper face depends mainly on the substrate temperature on crystal formation. The upper face becomes a trigonal or hexagonal {111} plane at a substrate temperature of from 400° to 900° C., preferably from 600° to 700° C., and becomes a tetragonal or octagonal {100} plane at a substrate temperature of from 950° to 1300° C., preferably from 1000° to 1200° C. When carbon source concentration is low in the diamond synthesis atmosphere, the upper face tends to become a {111} plane, and when it is high the upper face tends to become a {100} plane.

In the present invention, the plate-shaped diamond crystals formed at least in the initial stage of crystal growth are grown to coalesce by maintaining the orientation property into a film. The plate-shaped diamond crystals, which have a property to orient in a {111} plane or a {100} plane, grow and coalesce into a diamond film having a smooth surface or having little level difference at grain boundry to give little unevenness. Thereby the surface roughness of the resulting film (Rmax) is not more than 0.2 $\mu m$, generally not more than 0.1 $\mu m$, preferably not more than 0.08 $\mu m$. The formed diamond film is useful, as it is, as a diamond covered member in various uses. The diamond film may additionally be mirror-polished for improvement of the properties. Naturally this additional polishing can be conducted in a simple manner in a short time in comparison with mirror-polishing of usual polycrystalline diamond film, since the diamond film has been formed with sufficient smoothness.

The diamond film of the present invention, which is formed in an atmosphere of an oxygen-containing starting gas, is constituted of high-quality crystals and contains little amount of non-diamond carbon, especially graphite crystals. Therefore, the film is excellent in film hardness, oxidation resistance, and thermal conductivity, and has improved semiconductor characteristics.

The material for the substrate employed in the present invention includes semiconductor substrates such as silicon, germanium, GaAs, and InP; oxide type ceramics such as alumina, and zirconia; carbides and nitrides such as silicon carbide, silicon nitride, titanium carbide, titanium nitride, and tungsten carbide; nitride type ceramics; WC type super hard alloys; metals such as molybdenum, tungsten, tantalum, copper, gold, silver, and platinum; and the like. The shape of the substrate is decided, as desired, depending on the type of use, the object, and the use conditions. For example, in use for a reflective mirror, the surface of the substrate is made in a flat or curved shape, and the aforementioned diamond crystal film is deposited on the flat or curved surface through vapor phase synthesis.

The plate-shaped diamond crystals may be formed through a selective deposition method only on desired sites. The selective deposition of diamond crystal can be conducted, for example, by the method proposed by the inventor in Japanese Patent Application Laid-Open No. 2-30697. Further, according to the method disclosed in Japanese Patent Application Laid-Open No. 2-30697, a diamond crystal can be formed from a single nucleus by controlling the size of the nucleation site to be sufficiently small, not larger than 10 $\mu m^2$. When a diamond crystal is formed from a single nucleus by a burning flame process in which a nucleation density lower than other synthesis method is used, if the nucleation site is in a size of 10 $\mu m^2$ or less, deposition omission is liable to occur. Therefore, in order to grow a diamond crystal from a single nucleus in the burning flame process, the size of the nucleation site is made to be not larger than 100 $\mu m^2$ but not smaller than 10 $\mu m^2$, preferably in the range of from 25 $\mu m^2$ to 80 $\mu m^2$.

The selective deposition of diamond on desired sites can be conducted, for example, according to the process disclosed in the above Japanese Patent Application Laid-Open No. 2-30697, but the deposition process is not limited thereto. In the method of this Japanese Patent Application, a substrate is subjected to a scratching treatment, a patterned mask is formed on the substrate, the substrate is subjected to etching treatment, and then the mask is removed to obtain a scratched site in a pattern. Otherwise, the scratched site can be formed in a pattern by forming a patterned mask on the substrate, scratching the substrate surface, and removing the mask by etching. In another method, the substrate is subjected to a scratching treatment, and on the scratched substrate, a mask is formed in a pattern with a heat resistant material to form a scratched portion in a pattern on the substrate surface. The scratching treatment with diamond abrasive grains is not limited to a special method, and includes grinding, ultrasonic treatment, sand-blasting, and the like by use of diamond abrasive grains.

An example of selective deposition of diamond on a substrate is explained below by reference to the schematic drawings of FIG. 5A to FIG. 5F, where the substrate is scratched in a pattern by use of diamond abrasive grains.

Initially, the surface of the substrate 51 is treated for scratching with diamond abrasive grains (Step A). Masks 52 are formed on the substrate surface (Step B). The material of the mask is not specially limited. An example of the mask material is a resist formed in a pattern by photolithography. Subsequently the substrate having the masks 52 thereon is etched to form a pattern of the scratched portions (Step C). The etching may be conducted either by dry etching or by wet etching. The wet etching is conducted, for example, by use of a hydrofluoric acid-nitric acid mixture. The dry etching is conducted, for example, by plasma etching method, or ion beam etching. The etching gas for plasma etching includes $CF_4$ gas, and $CF_4$ gas having added oxygen gas, argon gas, or the like. The etching gas for ion beam etching includes rare gases such as argon, helium, and neon; oxygen, fluorine, hydrogen, $CF_4$, and the like. The etching depth is not less than 10 nm, preferably in the range of from about 50 to about 1000 nm, more preferably from about 80 to about 200 nm. Subsequently, the masks 52 are removed (Step D). When diamond is formed thereon by a vapor-phase synthesis method, plate-shaped diamond crystals 53 are formed selectively on the scratch-treated sites (Step E). The plate-shaped diamond crystals are grown and allowed to coalesce into a diamond crystal film 54 which is highly oriented and has less surface roughness, thereby obtaining a diamond covered menber (Step F). The thickness of the above diamond film required for achieving high orientation degree and little surface roughness depends on the synthesis conditions, particularly on the nucleation density, and cannot be simply predicted. Generally, such diamond crystal film can be obtained when the thickness is about 10 $\mu$m.

On the above diamond crystal film of the diamond covered member of the present invention, a semiconductor element can be formed. For example, on the diamond crystal film, a diamond semiconductor may be formed which contains impurities such as Group 3b or 5b elements of Periodic Table. A semiconductor crystal silicon, germanium, gallium arsenide, or the like may be formed.

The present invention is described specifically by reference to Examples without limiting the invention.

EXAMPLE 1

Figure 3:
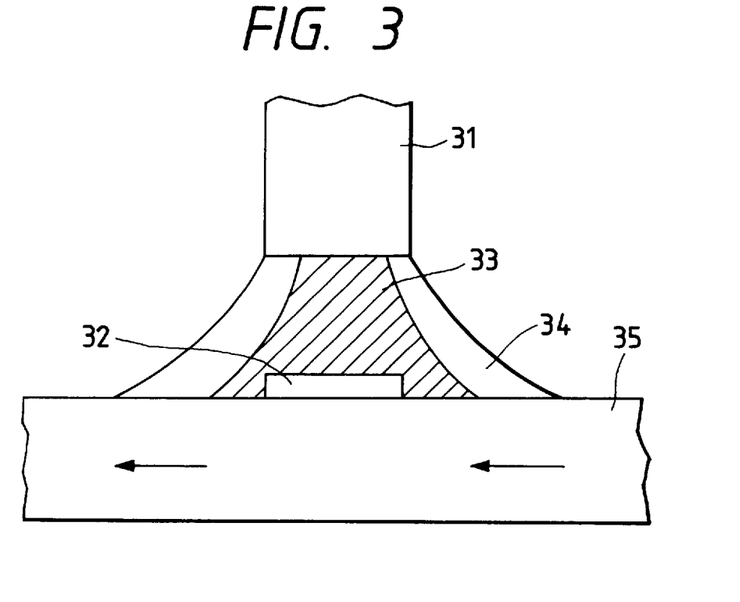
FIG. 3 illustrates schematically diamond formation by a burning flame process.

A diamond crystal film was formed by a burning flame method. FIG. 3 illustrates schematically a burning flame method with an oxygen-acetylene flame burner. In the drawing, the numeral 31 denotes a burner; 32, a substrate; 33, inner flame; 34, outer flame; and 35, a substrate holder. The substrate is cooled by cooling the substrate holder with water.

A sintered compact of silicon carbide was worked into a plate of 50 mm in diameter and 8 mm in thickness. Thereon, a polycrystalline silicon carbide film was formed by CVD. The surface of the formed film was mirror-polished to obtain surface roughness of Rmax=0.04 $\mu$m. This plate, after sufficient washing, was placed as the substrate in a burning flame deposition apparatus illustrated in FIG. 3. A diamond crystal film was formed by the burning flame method under the conditions: gases and flow rates: acetylene (2 l/min) and oxygen (1.91 l/min) ($O_2/C_2H_2$=0.95), substrate temperature: 650° C., and synthesis time: 3 hours. The resulting diamond crystal film was a polycrystal film having a {111} orientation plane and surface roughness (Rmax) of 0.13 $\mu$m.

Separately, another sample was prepared by use of the same substrate and under the same conditions except for synthesis time of one hour. By scanning electron microscopy observation, the deposited matter was found to be plate-shaped hexagonal diamond crystals which have respectively a particle diameter of about 10 $\mu$m, an upper face of a {111} plane, and ratio of height to breadth of 1:not less than 4. The crystals were observed to be dispersed at a deposit density of about 4000 crystals/mm$^2$ on the substrate.

The diamond covered member of this Example was used as a mirror for excimer laser. As the results, the reflectivity was excellent and no damage was caused by the laser irradiation.

COMPARATIVE EXAMPLE 1

A diamond crystal film was formed and a diamond covered member was prepared in the same manner as in Example 1 except for the ratio $O_2/C_2H_2$=0.85. The resulting diamond film was a polycrystal film exhibiting no orientation, and has a surface roughness (Rmax) of 0.5 $\mu$m. Therefore, this diamond covered member was obviously not useful for a mirror of an excimer laser. For comparison, this diamond covered member was exposed to laser irradiation, and found that the film was damaged by the laser irradiation. The damage was considered to be due to the change of the diamond film into graphite by heat and dissipation of the graphite by oxidation. Another sample was prepared for observation of the crystals, and was observed by scanning electron microscopy in the same manner as in Example 1. It was found that the deposited matter is not plate-shaped diamond crystals, but granular diamond crystals.

EXAMPLE 2

Figure 4:
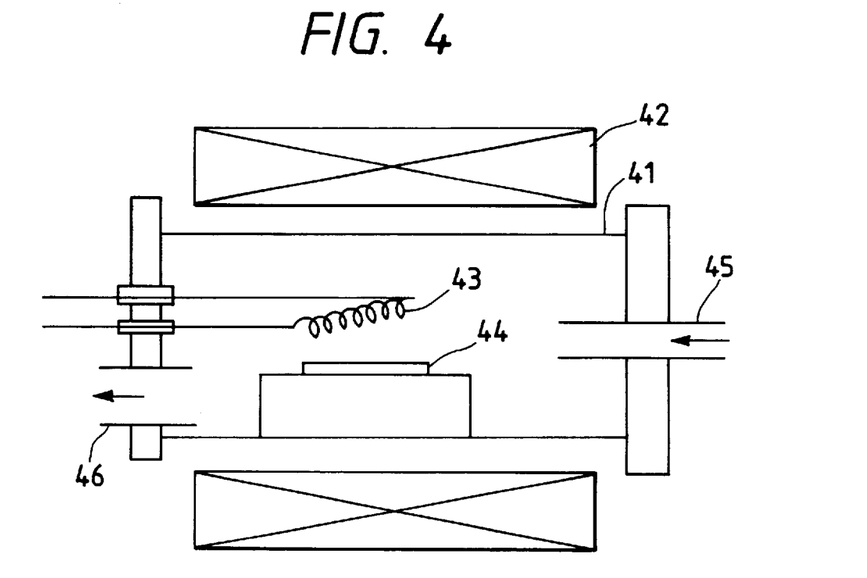
FIG. 4 illustrates schematically diamond formation by a hot filament CVD process.
Figure 5A:
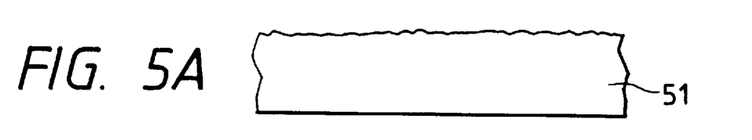
FIGS. 5A, 5B, 5C, 5D, 5E and 5F illustrate schematically steps of selective deposition.
Figure 5B:
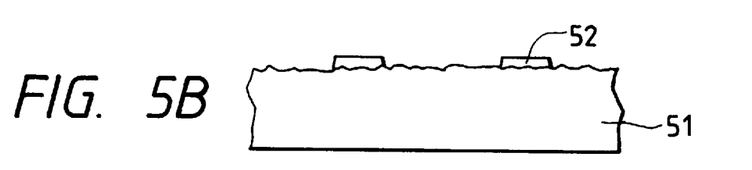
Figure 5C:
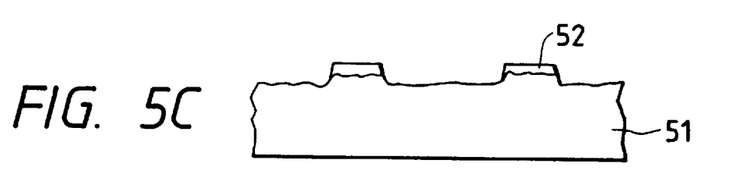
Figure 5D:
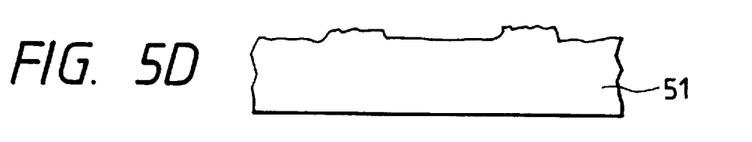
Figure 5E:
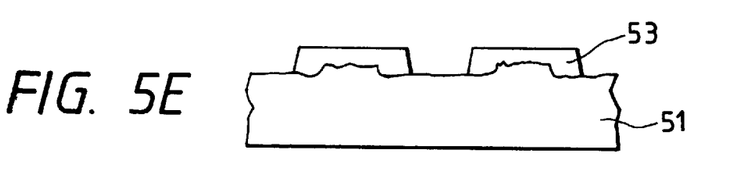
Figure 5F:
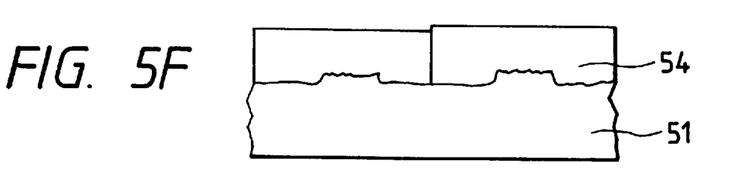

A diamond crystal was formed by hot filament CVD. FIG. 4 illustrates schematically a hot filament CVD system employing hydrogen-ethyl alcohol as starting gas. In the drawing, the numeral 41 denotes a quartz reaction tube; 42, an electric furnace; 43, a filament made of tantalum; 44, a substrate; 45, a starting gas inlet to which gas cylinders, an alcohol vaporizer, flow controllers, valves, etc. are connected which are not shown in the drawing; and 46, a gas outlet to which a pressure control valve, and an evacuation system (combination of a mechanical booster pump and a rotary pump) are connected which are not shown in the drawing.

A sintered compact of silicon carbide was worked into a plate of 40 mm in diameter and 5 mm in thickness. Thereon, a polycrystalline silicon carbide film was formed by CVD. The surface of the formed film was mirror-polished to obtain surface roughness of Rmax=0.04 $\mu$m. This plate was used as the substrate. The substrate was subjected preliminarily to scratching treatment with silicon carbide abrasive grains (1 $\mu$m or less). The substrate, after sufficient washing, was placed in the apparatus shown in FIG. 4, and thereon diamond was synthesized under the conditions: starting gases and flow rates: hydrogen (200 ml/min), and ethyl alcohol (2 ml/min), filament temperature: 2050° C., substrate temperature: 650° C., pressure: 1.3×10⁴ Pa, synthesis time: 10 hours. As the result, a diamond polycrystal film was obtained which has a {111} orientation and surface roughness (Rmax) of 0.10 μm.

Separately, another sample was prepared by use of the same substrate and under the same conditions except for synthesis time of 3 hours. This sample was examined by scanning electron microscopy, and it was observed that plate-shaped hexagonal diamond crystals were formed which have respectively a particle diameter of about 4 μm, an upper face of a {111} plane, and ratio of height to breadth of 1:not less than 4.

The above diamond covered member was subjected to usual lapping treatment to polish the surface to surface roughness of 0.02 μm. This diamond covered member was used as a mirror for excimer laser. The reflectivity was excellent, and no damage was caused by the laser irradiation.

EXAMPLE 3

A diamond crystal was formed by microwave plasma CVD. A silicon single-crystal plate of a predetermined shape as the substrate was subjected preliminarily to scratching treatment with silicon carbide abrasive grains (not larger than 1 μm). This substrate, after sufficient washing, was placed in a microwave plasma CVD apparatus. A diamond crystal film was formed under the conditions: gases and flow rates: hydrogen (100 ml/min), carbon monoxide (5 ml/min), substrate temperature: 650° C., pressure: 1.3×10⁴ Pa, microwave output: 500 W, and synthesis time: 12 hours. The resulting diamond crystal was a polycrystal having a {111} orientation plane and surface roughness (Rmax) of 0.08 μm.

Separately, another sample was prepared, for observation of crystal formation, by use of the same substrate and under the same conditions as above except for synthesis time of 4 hours. This sample was examined by scanning electron microscopy, and it was observed that plate-shaped hexagonal diamond crystals were formed on the substrate surface, the crystals having respectively a particle diameter of about 4 μm, an upper face of a {111} plane, and ratio of height to breadth of 1:not less than 4.

Still another sample was prepared, for thermal conductivity measurement, under the same conditions as mentioned above, and was subjected to measurement of thermal conductivity by known AC calorimetry. The thermal conductivity was found to be as high as 1800 W/(m.K).

The prepared diamond covered member, which serves as a heat sink, was cut in a desired size, and thereon a laser diode was bonded. The dependence of the temperature rise on the input power applied to the laser diode was measured. As the results, the temperature rise of the laser diode was found to be retarded, which shows satisfactory characteristics of the member as the heat sink.

COMPARATIVE EXAMPLE 2

A diamond crystal was formed in the same manner as in Example 3 except that the CO gas flow rate was 20 ml/min. The resulting diamond film was a polycrystal film exhibiting no orientation and having surface roughness (Rmax) of 0.08 μm. Another sample was prepared for observation of crystal formation. As the result of scanning electron microscopy observation in the same manner as in Example 3, the deposited matter was found to be not a plate-shaped diamond crystal, but a granular diamond crystal. Raman spectroscopic analysis of this sample showed that amorphous carbon and graphite-like carbon exist in the formed film in addition to the diamond crystals. A still another sample was prepared in the same manner for thermal conductivity measurement. The thermal conductivity was found to be 700 W/(m.K) by AC calorimetry conducted in the same manner as in Example 3.

The prepared diamond covered member, as a heat sink, was cut in a desired size, and thereon a laser diode was bonded. The dependence of the temperature rise on the input power applied to the laser diode was measured. As the results, the temperature rise of this laser diode was twice or more that of the one prepared in Example 3, which showed deterioration of characteristics of the covering member as the heat sink.

EXAMPLE 4

A diamond covered member (a heat sink) was prepared by formation of plate-shaped diamond crystals on desired positions by selective deposition and allowing the crystals to grow and coalesce into a film.

A silicon carbide single-crystal was used as the substrate. The substrate was washed sufficiently, and then subjected to scratching treatment, by means of an ultrasonic washer, in ethanol which contained diamond abrasive grains dispersed therein. On the substrate, a pattern of a resist (PMMA type resist) was formed in 2 μm diameter and 10 μm pitch by means of a mask aligner. In the formation of the resist pattern, interstices in the mask pattern were provided without forming the mask pattern thereon to prevent diamond deposition so as to facilitate cutting of the substrate into a desired size of the heat sink. The substrate was etched by using argon gas in an ion beam etching apparatus under the conditions: pressure 2×10⁻⁴ Pa, acceleration voltage: 500 V, current density: 0.5 mA/cm², and treating time: 10 minutes. This treatment resulted in about 100 nm of etching. Then, the substrate was subjected to resist removal and washing with an organic solvent. Thereon, plate-shaped diamond crystals were synthesized by the same hot-filament CVD apparatus as in Example 2 under the conditions: starting gases and flow rates: hydrogen (200 ml/min) and ethyl alcohol (2 ml/min), filament temperature: 2100° C., substrate temperature: 670° C., Pressure 1.3×10⁴ Pa, and synthesis time: 10 hours. The resulting diamond crystal was a polycrystal having a {111} face orientation and surface roughness (Rmax) of 0.06 μm.

Separately, another sample was prepared, for measurement, by use of the same substrate and under the same conditions as above except for the synthesis time of 2 hours. This sample was examined by scanning electron microscopy, and it was observed that plate-shaped hexagonal diamond crystals were selectively formed on the substrate surface at the positions where the mask pattern had been formed, and the crystals had respectively a particle diameter of about 3 μm, an upper face having a {111} plane, and ratio of height to breadth of 1:not less than 4.

Still another sample was prepared, for thermal conductivity measurement, under the same conditions as mentioned above, and was subjected to measurement of thermal conductivity by known AC calorimetry. The thermal conductivity was found to be as high as 820 W/(m.K).

The prepared diamond covered member, as a heat sink, was cut out along the preliminarily formed interstice, and thereon a laser diode was bonded. The dependence of the temperature rise on the input power applied to the laser diode was measured. As the results, the temperature rise of the laser diode was found to be retarded, which showed satisfactory characteristics of the member as the heat sink.

As described above, the present invention provides a diamond covered member which has a diamond crystal layer formed by vapor phase synthesis on a substrate surface, the diamond crystal layer being constituted of plate-shaped diamond crystals at least at an initial stage of crystal growth, and being formed by growth and coalescence of the plate-shaped diamond crystals. The diamond crystal layer is highly oriented, and has surface roughness (Rmax) of not larger than 0.2 μm. Thus the resulting diamond covered member has good crystallinity, high thermal conductivity, and high surface smoothness.

Such a diamond covered member, which has high hardness, high thermal conductivity, and high chemical stability, is useful for cutting tools, abrasion-resistant tools, heat sinks, and so forth. The member is also useful for optical parts owing to its surface smoothness. Furthermore, a diamond semiconductor can be formed by employing the diamond covered member as a diamond substrate and doping it. Therefore, the present invention provides various industrial advantages.

What is claimed is:

1. A process for producing a diamond covered member having a diamond crystal layer formed by vapor phase synthesis on a surface of a substrate other than a diamond substrate, the process comprising selectively depositing plate-shaped diamond crystals having an upper face of a {111} plane or {100} plane by CVD at a carbon source concentration ranging from 0.01 to 10% at an atomic ratio of oxygen to carbon (O/C) of $0.5 \leq (O/C) \leq 1.2$ in a starting gas, wherein the plate-shaped diamond crystals are formed at a nucleation density of $2.0 \times 10^6$ nuclei/mm$^2$ or less, and growing the plate-shaped diamond crystals to coalesce into a film to form the diamond crystal layer.

2. The process for producing a diamond covered member according to claim 1, wherein the plate-shaped diamond crystals are formed by selective deposition on selected positions on a substrate, and the plate-shaped crystals are grown to coalesce into a film to form the diamond crystal layer.

3. The process for producing a diamond covered member according to claim 1, wherein the plate-shaped diamond crystals are selectively formed at a nucleation density within a range of $1.0 \times 10^2$ to $1.0 \times 10^5$ nuclei/mm$^2$, and wherein during the formation of the plate-shaped diamond crystals, the substrate is kept at a temperature within a range of 400°–900° C. or 950°–1300° C.

4. A process for producing a diamond covered member having a diamond crystal layer formed by vapor phase synthesis on a surface of a substrate other than a diamond substrate, the process comprising selectively depositing plate-shaped diamond crystals having an upper face of a {111} plane or {100} plane by a burning flame method by use of oxygen-acetylene flame at a molar ratio of oxygen to acetylene in a main starting gas being in a range of $0.9 \leq (O_2/C_2H_2) \leq 1.0$, wherein said plate-shaped crystals are formed at a nucleation density of $1.0 \times 10^5$ nuclei/mm$^2$ or less, and growing the plate-shaped diamond crystals to coalesce into a film to form the diamond crystal layer.

5. The process for producing a diamond covered member according to claim 4, wherein the plate-shaped diamond crystals are formed by selective deposition on selected positions on a substrate, and the plate-shaped crystals are grown to coalesce into a film to form the diamond crystal layer.

6. The process for producing a diamond covered member according to claim 4, wherein the plate-shaped diamond crystals are selectively formed at a nucleation density within a range of $1.0 \times 10^2$ to $1.0 \times 10^5$ nuclei/mm$^2$, and wherein during the formation of the plate-shaped diamond crystals, the substrate is kept at a temperature within a range of 400°–900° C. or 950°–1300° C.

\* \* \* \* \*

UNITED STATES PATENT AND TRADEMARK OFFICE
CERTIFICATE OF CORRECTION

PATENT NO. : 5,807,432

DATED : September 15, 1998

INVENTOR(S) : KEIJI HIRABAYASHI

It is certified that error appears in the above-identified patent and that said Letters Patent is hereby corrected as shown below:

<u>COLUMN 1</u>

Line 22, "of" should read --of a--.

<u>COLUMN 6</u>

Line 22, "contains" should read --contains a--.

<u>COLUMN 8</u>

Line 7, "(2 1/min)" should read --(2 1/min)--.
    Line 8, "(1.91 1/min)" should read --(1.91 1/min)--.

<u>COLUMN 10</u>

Line 44, "Pressure" should read --pressure:--.

Signed and Sealed this

Fourth Day of May, 1999

Attest:

Q. TODD DICKINSON

Attesting Officer     Acting Commissioner of Patents and Trademarks